United States Patent

Tai et al.

(10) Patent No.: US 10,547,292 B2
(45) Date of Patent: Jan. 28, 2020

(54) ELECTRIC CIRCUIT DEVICE

(71) Applicant: Honda Motor Co., Ltd., Tokyo (JP)

(72) Inventors: Shintaro Tai, Utsunomiya (JP);
Tetsuya Onodera, Utsunomiya (JP)

(73) Assignee: HONDA MOTOR CO., LTD., Tokyo (JP)

(*) Notice: Subject to any disclaimer, the term of this patent is extended or adjusted under 35 U.S.C. 154(b) by 284 days.

(21) Appl. No.: 15/410,013

(22) Filed: Jan. 19, 2017

(65) Prior Publication Data
US 2017/0214393 A1 Jul. 27, 2017

(30) Foreign Application Priority Data

Jan. 25, 2016 (JP) ................. 2016-011534

(51) Int. Cl.
H03K 3/013 (2006.01)
B60L 58/10 (2019.01)
(Continued)

(52) U.S. Cl.
CPC ......... *H03K 3/013* (2013.01); *G01R 19/0084* (2013.01); *G01R 31/006* (2013.01); *G01R 31/3835* (2019.01); *H03F 3/45* (2013.01)

(58) Field of Classification Search
CPC .. H03F 3/45; H03K 3/013; H05K 1/02; B60L 11/18; G01R 19/00; G01R 31/00; G01R 31/36
See application file for complete search history.

(56) References Cited

U.S. PATENT DOCUMENTS

| 6,198,619 B1* | 3/2001 | Fujioka | H05K 1/162 361/328 |
| 2005/0101188 A1* | 5/2005 | Benham | H01R 12/91 439/620.01 |
| 2014/0015316 A1* | 1/2014 | Schoenknecht | B60L 3/04 307/10.1 |

FOREIGN PATENT DOCUMENTS

| CN | 1926928 A | 3/2007 |
| CN | 101651237 A | 2/2010 |

(Continued)

OTHER PUBLICATIONS

Cited in Office Action dated Nov. 23, 2018, issued in counterpart Chinese Application No. 201710040230.4, with English translation (11 pages).

(Continued)

*Primary Examiner* — Jared Fureman
*Assistant Examiner* — Emmanuel Dominique
(74) *Attorney, Agent, or Firm* — Westerman, Hattori, Daniels & Adrian, LLP

(57) ABSTRACT

An electric circuit device including a first high voltage serial connection circuit 2a and a second high voltage serial connection circuit 3a, those are provided on a board and connected to an end of high electric potential of a power source for automobile use; and a first low voltage serial connection circuit 2b and a second low voltage serial connection circuit 3b, those are provided on the board and connected to an end of low electric potential of the power source for automobile use, wherein the first high voltage serial connection circuit 2a and the second high voltage serial connection circuit 3a are respectively disposed on both surfaces of the board opposite to each other, and the first low voltage serial connection circuit 2b and the second low voltage serial connection circuit 3b are respectively (Continued)

disposed on the both surfaces of the board opposite to each other.

6 Claims, 4 Drawing Sheets

(51) Int. Cl.
    *G01R 31/3835*    (2019.01)
    *G01R 19/00*    (2006.01)
    *G01R 31/00*    (2006.01)
    *H03F 3/45*    (2006.01)

(56) References Cited

FOREIGN PATENT DOCUMENTS

| | | |
|---|---|---|
| CN | 102053650 A | 5/2011 |
| CN | 103782476 A | 5/2014 |
| EP | 2957762 A1 | 12/2015 |
| JP | 2007-258353 A | 10/2007 |
| JP | 2011-23384 A | 2/2011 |

OTHER PUBLICATIONS

Office Action dated Sep. 3, 2019, issued in counterpart JP Application No. 2016-011534, with English translation (4 pages).

\* cited by examiner

ELECTRIC CIRCUIT DEVICE

CROSS-REFERENCE TO RELATED APPLICATIONS

Priority is claimed on Japanese Patent Application No. 2016-011534, filed on Jan. 25, 2016, the contents of which are incorporated herein by reference.

BACKGROUND

Field of the Invention

The present invention relates to an electric circuit device.

Background

An electric circuit device for monitoring a voltage of a power source for automobile use is connected to a positive electrode side and a negative electrode side of the power source for automobile use, and a high voltage is to be applied to an electric circuit. Therefore, generally speaking, the voltage is reduced by plural resistance elements connected serially. For example, Japanese Patent Application, Publication No. 2007-258353 discloses an electric circuit device of passive circuit element serial connection type for detecting a voltage of a power source for automobile use. The electric circuit device of passive circuit element serial connection type in the Japanese Patent Application, Publication No. 2007-258353 is downsized by placing serial connection circuits on both surfaces of a board and by curving and disposing the serial connection circuits.

SUMMARY

When placing the serial connection circuits on the both surfaces of the layout board, floating capacitance is generated between the serial connection circuit placed on a front surface and the serial connection circuit placed on a back surface. This floating capacitance causes a delay of control signal. In the electric circuit device of passive circuit element serial connection type in the Japanese Patent Application, Publication No. 2007-258353, a serial connection circuit of the positive electrode side is placed on the front surface of the wiring board and a serial connection circuit of the negative electrode side is placed on the back surface. Thus, as a distance in a normal line direction of the surface of the board between the serial connection circuit of the positive electrode side and the serial connection circuit of the negative electrode side is short, thus, a large floating capacitance is generated. Accordingly, the delay of control signal of the electric circuit device is enlarged, and a control response capability thereof is decreased.

An aspect of the present invention improves a control response capability of an electric circuit device by reducing generation of a floating capacitance of the electric circuit device placed on the both surfaces of the board.

An aspect of the present invention is an electric circuit device including: a first high voltage serial connection circuit and a second high voltage serial connection circuit, those are provided on a board and connected to an end of high electric potential of a power source for automobile use; and a first low voltage serial connection circuit and a second low voltage serial connection circuit, those are provided on the board and connected to an end of low electric potential of the power source for automobile use, wherein the first high voltage serial connection circuit and the second high voltage serial connection circuit are respectively disposed on both surfaces of the board opposite to each other, and the first low voltage serial connection circuit and the second low voltage serial connection circuit are respectively disposed on the both surfaces of the board opposite to each other.

In the electric circuit device described above, at least a portion of the second high voltage serial connection circuit may be disposed, being displaced from the first high voltage serial connection circuit in a normal line direction of the surface of the board, and at least a portion of the second low voltage serial connection circuit may be disposed, being displaced from the first low voltage serial connection circuit in the normal line direction of the surface of the board.

In the electric circuit device described above, at least either one of the first high voltage serial connection circuit, the second high voltage serial connection circuit, the first low voltage serial connection circuit and the second low voltage serial connection circuit may be curved and disposed on the board.

In the electric circuit device described above, at least either one of the first high voltage serial connection circuit, the second high voltage serial connection circuit, the first low voltage serial connection circuit and the second low voltage serial connection circuit mat be curved like a U shape and disposed on the board.

In the electric circuit device described above, at least either one of the first high voltage serial connection circuit, the second high voltage serial connection circuit, the first low voltage serial connection circuit and the second low voltage serial connection circuit may be disposed like a straight line on the board.

According to the aspect of the present invention, the first high voltage serial connection circuit and the first low voltage serial connection circuit are disposed remote from each other in the normal line direction of the surface of the board. And the second high voltage serial connection circuit and the second low voltage serial connection circuit are disposed remote from each other in the normal line direction of the surface of the board. In this way, floating capacitance is unlikely to be generated between the first high voltage serial connection circuit and the first low voltage serial connection circuit as well as between the second high voltage serial connection circuit and the second low voltage serial connection circuit. Accordingly, it is possible to improve the control response capability of the electric circuit device by reducing generation of the floating capacitance of the electric circuit device placed on the both surfaces of the board.

BRIEF DESCRIPTION OF THE REFERENCE NUMERALS

Figure 1:
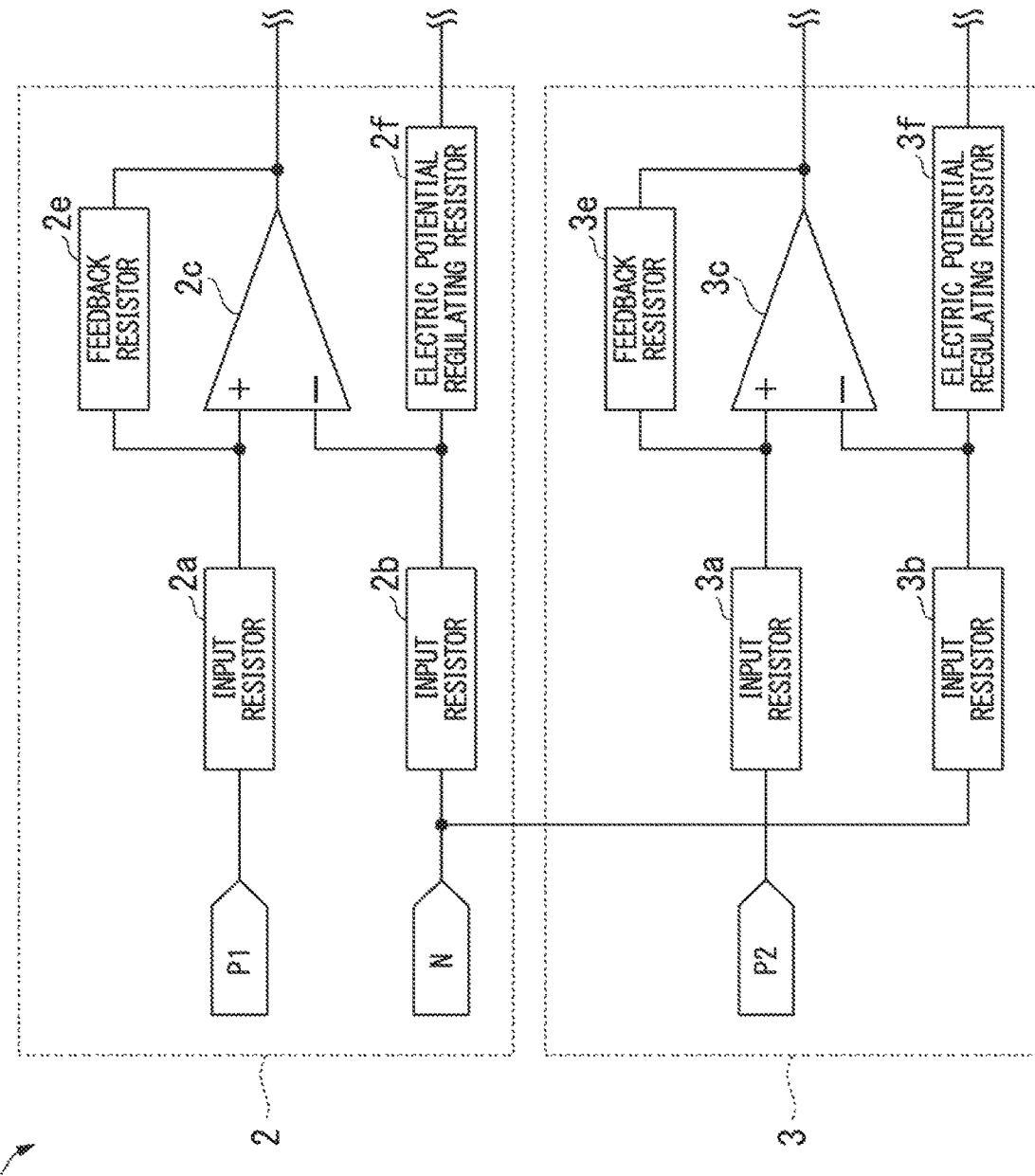
FIG. 1 is a circuit diagram showing a configuration of an electric circuit device of an embodiment of the present invention.
Figure 2A:
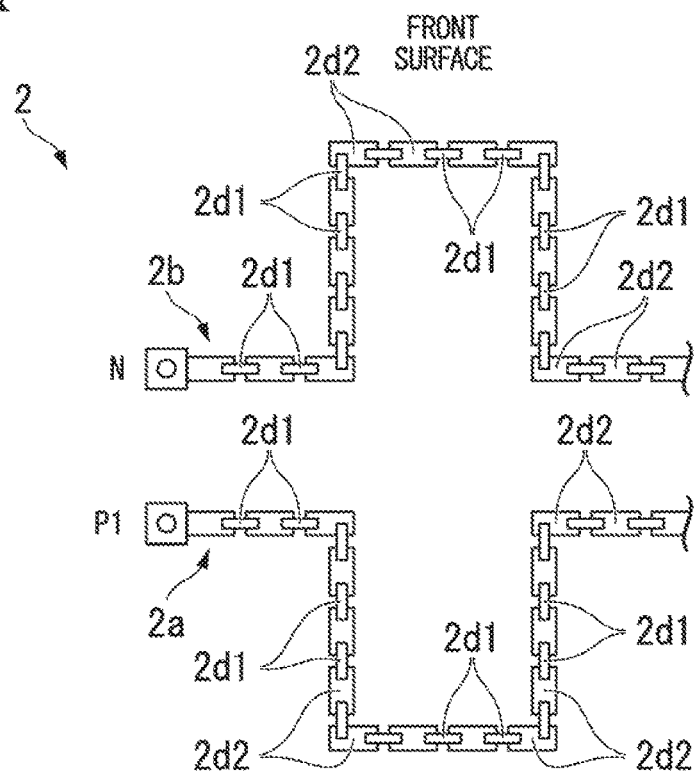
FIG. 2A is a figure showing a serial connection circuit included in the electric circuit device of the embodiment of the present invention, and is a layout diagram of the serial connection circuit on a front surface of a board.
Figure 2B:
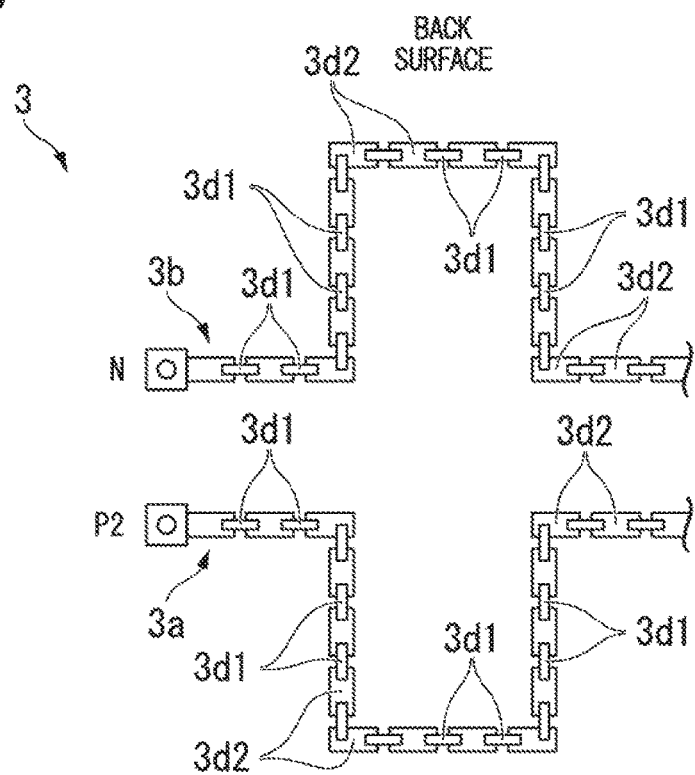
FIG. 2B is a figure showing the serial connection circuit included in the electric circuit device of the embodiment of the present invention, and is a layout diagram of the serial connection circuit on a back surface of the board.

1 Electric Circuit Device
2 First Differential Voltage Amplifier Circuit
2a Pre-Boost Serial Connection Circuit
2b Negative Electrode Side Serial Connection Circuit
2c First Operational Amplifier
2d1 Input Resistor Element
2d2 Conductor Layer
2e Feedback Resistor
2f Electric Potential Regulating Resistor
3 Second Differential Voltage Amplifier Circuit
3a Post-Boost Serial Connection Circuit
3b Negative Electrode Side Serial Connection Circuit
3c Second Operational Amplifier
3d1 Input Resistor Element
3d2 Conductor Layer
3e Feedback Resistor
3f Electric Potential Regulating Resistor Hereinafter, an electric circuit device 1 of an embodiment of the present invention will be described with reference to the FIG. 1, FIG. 2A and FIG. 2B. FIG. 1 is a circuit diagram showing a configuration of the electric circuit device 1 of the present embodiment. FIG. 2A is a figure showing a serial connection circuit included in the electric circuit device 1 of an embodiment of the present invention, and is a layout diagram of the serial connection circuit on a front surface of a board. FIG. 2B is a figure showing the serial connection circuit included in the electric circuit device 1 of the embodiment of the present invention, and is a layout diagram of the serial connection circuit on a back surface of the board. Additionally, FIG. 2A and FIG. 2B are respectively showing a front surface and a back surface of the same area on the board.

The electric circuit device 1 is a device for detecting a voltage of a power source for automobile use. For example, the electric circuit device 1 is provided to a high voltage battery of a hybrid vehicle, and monitors the voltage of the high voltage battery connected to a motor. The high voltage battery includes a positive electrode and a negative electrode, and a voltage of the positive electrode side is applied to the motor after being boosted by a voltage boosting circuit which is not shown in figures. The electric circuit device 1 as described above includes a first differential voltage amplifier circuit 2 and a second differential voltage amplifier circuit 3 in general.

The first differential voltage amplifier circuit 2 is provided on a front surface of the board and including a pre-boost serial connection circuit 2a (a first high voltage serial connection circuit), a negative electrode side serial connection circuit 2b (a first low voltage serial connection circuit), a first operational amplifier 2c, a feedback resistor 2e and an electric potential regulating resistor 2f. The pre-boost serial connection circuit 2a is connected to a positive electrode side of the power source for automobile which is not shown in figures and also to the first operational amplifier 2c. The pre-boost serial connection circuit 2a includes plural input resistor elements 2d1. As shown in FIG. 2A, the pre-boost serial connection circuit 2a is formed by serially connecting input resistor elements 2d1 with conductor layers 2d2 interposed therebetween. The pre-boost serial connection circuit 2a is curved more than one time by a right angle substantially like a U shape and disposed on the board. The pre-boost serial connection circuit 2a as described above causes a voltage P1 input from the positive electrode side of the power source for automobile to drop by resistance voltage division, then causes to input to the positive electrode side of the first operational amplifier 2c.

The negative electrode side serial connection circuit 2b is connected to a negative electrode side of the power source for automobile use and also to the first operational amplifier 2c. The negative electrode side serial connection circuit 2b includes input resistance element 2d1. As shown in FIG. 2A, the negative electrode side serial connection circuit 2b is formed by serially connecting input resistor elements 2d1 with conductor layers 2d2 interposed therebetween. As shown in FIG. 2A, the negative electrode side serial connection circuit 2b is formed by aligning input resistor elements 2d1 so as to curve more than one time by a right angle. In this way, the negative electrode side serial connection circuit 2b is disposed on the surface of the board opposite to the pre-boost serial connection circuit 2a. The negative electrode side serial connection circuit 2b as described above causes a voltage N input from the negative electrode side of the power source for automobile to drop, and then causes to input to the negative electrode side of the first operational amplifier 2c.

The first operational amplifier 2c outputs a voltage V1 based on a difference between the voltage input from the pre-boost serial connection circuit 2a and the voltage input from the negative electrode side serial connection circuit 2b. A microcontroller is connected to the first operational amplifier 2c at, for example, an output side, and the voltage V1 of the first operational amplifier 2c is monitored by the microcontroller. The feedback resistor 2e is connected to the positive side of the first operational amplifier 2c and also to the output side of the first operational amplifier 2c. The electric potential regulating resistor 2f is connected to the negative side of the first operational amplifier 2c. The first differential voltage amplifier circuit 2 as described above is a circuit for amplifying a difference of the electric potential between the voltage P1, the voltage of the positive side of the power source for automobile use, and the voltage N, the voltage of the negative side of the power source for automobile use.

The second differential voltage amplifier circuit 3 is provided on a back surface of the board and including a post-boost serial connection circuit 3a (a second high voltage serial connection circuit), a negative electrode side serial connection circuit 3b (a second low voltage serial connection circuit), a second operational amplifier 3c, a feedback resistor 3e and an electric potential regulating resistor 3f. The post-boost serial connection circuit 3a is connected to a voltage boosting circuit which is not shown in figures and also to the second operational amplifier 3c. The post-boost serial connection circuit 3a includes input resistor element 3d1. As shown in FIG. 2B, the post-boost serial connection circuit 3a is formed by serially connecting plural input resistor elements 2d1 with conductor layers 2d2 interposed therebetween. The post-boost serial connection circuit 3a is curved more than one time by a right angle substantially like a U shape and disposed on the board. The post-boost serial connection circuit 3a causes a voltage P2 boosted by the voltage boosting circuit to drop, and then causes to input to the positive electrode side of the second operational amplifier 3c. The post-boost serial connection circuit 3a as described above is disposed opposite to the pre-boost serial connection circuit 2a in a normal line direction of the surface of the board. In this way, a distance between the post-boost serial connection circuit 3a and the negative electrode side serial connection circuit 2b is longer than a distance between the post-boost serial connection circuit 3a and the pre-boost serial connection circuit 2a.

The negative electrode side serial connection circuit 3b is a branch of the input side of the negative electrode side serial connection circuit 2b and is connected to the second operational amplifier 3c. The negative electrode side serial connection circuit 3b includes plural input resistance elements 3d1. As shown in FIG. 2A, the negative electrode side serial connection circuit 3b is formed by aligning plural input resistor elements 3d1 so as to curve more than one time by a right angle. In this way, the negative electrode side serial connection circuit 3b is disposed on the surface of the board opposite to the post-boost serial connection circuit 3a. The negative electrode side serial connection circuit 3b as described above causes a voltage N input from the negative electrode side of the power source for automobile to drop, and then causes to input to the negative electrode side of the second operational amplifier 3c. In addition, the negative electrode side serial connection circuit 3b is disposed opposite to the negative electrode side serial connection circuit 2b in the normal line direction of the surface of the board, and is disposed remote from the pre-boost serial connection circuit 2a. In this way, a distance between the negative electrode side serial connection circuit 3b and the pre-boost serial connection circuit 2a is longer than a distance between the negative electrode side serial connection circuit 3b and the negative electrode side serial connection circuit 2b.

The second operational amplifier 3c outputs a voltage V2 based on a difference between the voltage input from the post-boost serial connection circuit 3a and the voltage input from the negative electrode side serial connection circuit 3b. A microcontroller is connected to the second operational amplifier 3c at, for example, an output side, and the voltage V2 of the first operational amplifier 3c is monitored by the microcontroller. The feedback resistor 3e is connected to the positive side of the second operational amplifier 3c and also to the output side of the second operational amplifier 3c. The electric potential regulating resistor 3f is connected to the negative side of the first operational amplifier 3c. The second differential voltage amplifier circuit 3 as described above amplifies a difference of the electric potential between the voltage P2, the voltage of the positive side of the power source for automobile use, which is boosted by the voltage boosting circuit, and the voltage N, the voltage of the negative side of the power source for automobile use.

In the electric circuit device 1 of the present embodiment, the pre-boost serial connection circuit 2a and the post-boost serial connection circuit 3a are disposed opposite to the pre-boost serial connection circuit 2a in the normal line direction of the surface of the board. Also, the negative electrode side serial connection circuit 2b and the negative electrode side serial connection circuit 3b are disposed opposite to the pre-boost serial connection circuit 2a in the normal line direction of the surface of the board. That is to say, the distance between the pre-boost serial connection circuit 2a and the negative electrode side serial connection circuit 3b as well as the distance between the post-boost serial connection circuit 3a and the negative electrode side serial connection circuit 2b are long. In this way, when the voltage P1 is applied to the pre-boost serial connection circuit 2a and the voltage P2 is applied to the post-boost serial connection circuit 3a, floating capacitance is unlikely to be generated. Therefore, the delay of control signal of the electric circuit device 1 is shortened, and a control response capability thereof can be improved.

Further, the difference of the electric potential between the pre-boost serial connection circuit 2a and the post-boost serial connection circuit 3a as well as the difference between the negative electrode side serial connection circuit 2b and the negative electrode side serial connection circuit 3b are small. Thus, an electric charge amount accumulated between the negative electrode side serial connection circuit 2b and the negative electrode side serial connection circuit 3b is small, the delay of control signal of the electric circuit device 1 is shortened, and the control response capability of the electric circuit device 1 is improved. Accordingly, the delay time of overvoltage detection signal to be input to the microcontroller is shortened, and as a result, a delay time of emergency shutoff control signal for shutting off the electric power to be supplied from the battery to the motor can be shortened in case overvoltage is occurred at a time of monitoring the voltage of the battery. In addition, by shortening a shutoff time, it is possible to increase an overvoltage threshold value at a time of monitoring the voltage of the battery, which enables to expand a range of operating voltage of electric components. Therefore, it is not necessary to use electric components of high voltage resistance conditions, which enables to effectively utilize component performance and reduce cost.

Each of the pre-boost serial connection circuit 2a, the negative electrode side serial connection circuit 2b, the post-boost serial connection circuit 3a and the negative electrode side serial connection circuit 3b of the present embodiment are curved like a U shape and disposed. In this way, comparing to a case in which the input resistor elements 2d1 and 3d1 are disposed like a straight line, it is possible to place even larger number of input resistor elements 2d1 and 3d1 in a predetermined area by serial connection.

In addition, the present invention is not limited to the above embodiments, however, a modification as below is possible, for example.

Figure 3A:
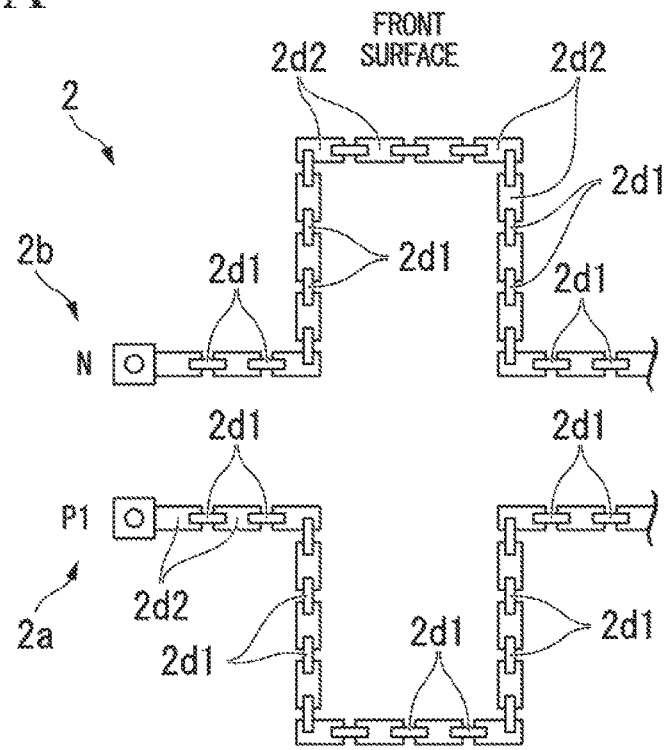
FIG. 3A a figure showing a modification of a serial connection circuit included in the electric circuit device of the embodiment of the present invention, and is a layout diagram of the serial connection circuit on a front surface of a board.
Figure 3B:
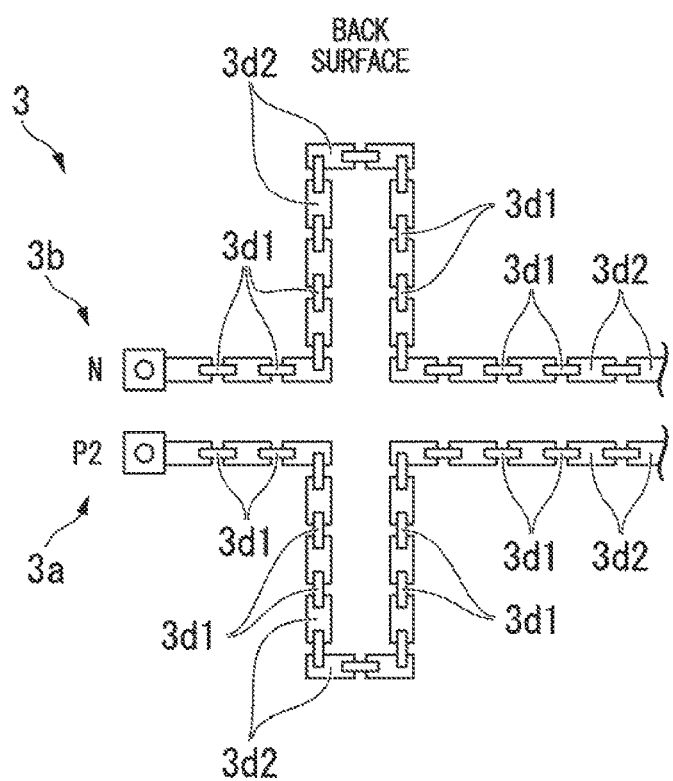
FIG. 3B is a figure showing the modification of the serial connection circuit included in the electric circuit device of the embodiment of the present invention, and is a layout diagram of the serial connection circuit on a back surface of the board.

(1) FIG. 3A a figure showing a modification of a serial connection circuit included in the electric circuit device of the embodiment of the present invention, and is a layout diagram of the serial connection circuit on a front surface of a board. FIG. 3B is a figure showing the modification of the serial connection circuit included in the electric circuit device of the embodiment of the present invention, and is a layout diagram of the serial connection circuit on a back surface of the board. Additionally, FIG. 3A and FIG. 3B are respectively showing a front surface and a back surface of the same area on the board.

As shown in these figures, the second differential voltage amplifier circuit 3 also can be disposed between the pre-boost serial connection circuit 2a and the negative electrode side serial connection circuit 2b of the first differential voltage amplifier circuit 2 in the normal line direction of the surface of the board. In the disposition as described, the post-boost serial connection circuit 3a and the negative electrode side serial connection circuit 3b are respectively displaced from the pre-boost serial connection circuit 2a and the negative electrode side serial connection circuit 2b in the normal line direction of the surface of the board. In this way, floating capacitance is unlikely to be generated between the pre-boost serial connection circuit 2a and the post-boost serial connection circuit 3a as well as between the negative electrode side serial connection circuit 2b and the negative electrode side serial connection circuit 3b, which enables to further improve the control response capability of the electric circuit device 1.

Figure 4A:
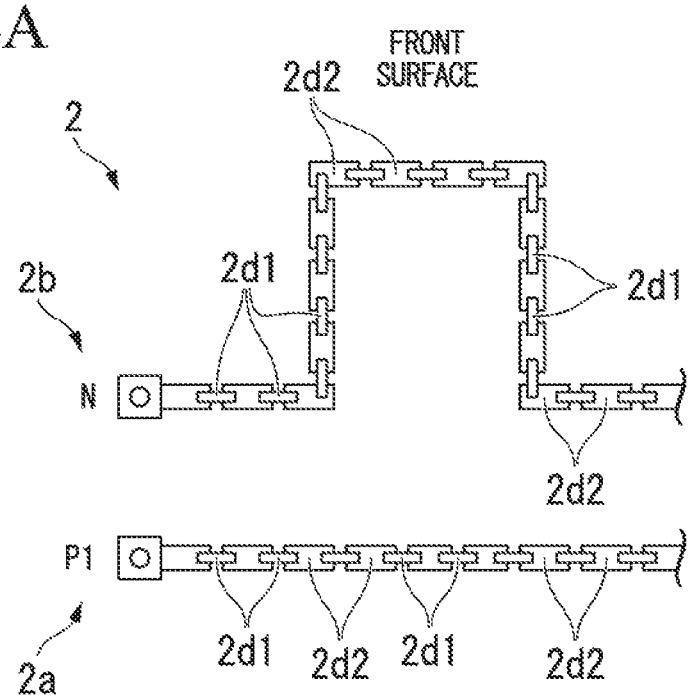
FIG. 4A a figure showing a modification of a serial connection circuit included in the electric circuit device of the embodiment of the present invention, and is a layout diagram of the serial connection circuit on a front surface of a board.

(2) FIG. 4A is a figure showing a modification of a serial connection circuit included in the electric circuit device of the embodiment of the present invention, and is a layout diagram of the serial connection circuit on a front surface of a board.

Figure 4B:
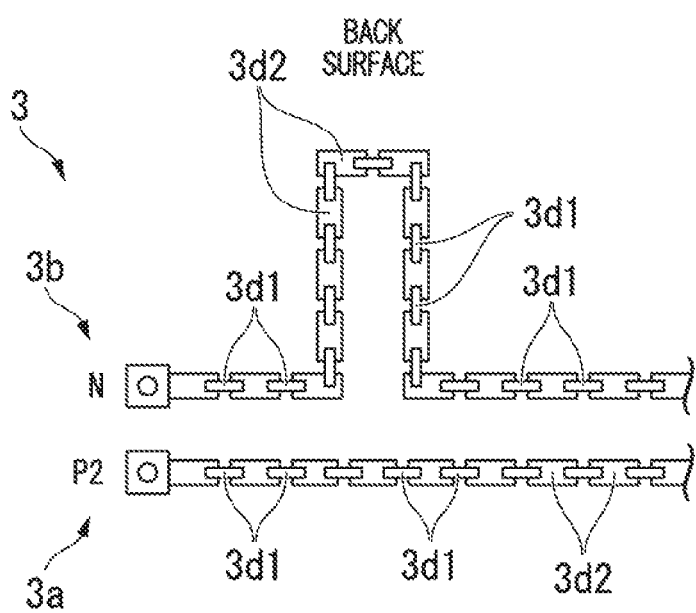
FIG. 4B is a figure showing the modification of the serial connection circuit included in the electric circuit device of the embodiment of the present invention, and is a layout diagram of the serial connection circuit on a back surface of the board.

FIG. 4B is a figure showing the modification of the serial connection circuit included in the electric circuit device of the embodiment of the present invention, and is a layout diagram of the serial connection circuit on a back surface of the board. Additionally, FIG. 4A and FIG. 4B are respectively showing a front surface and a back surface of the same area on the board.

As shown in these figures, it is possible to dispose the pre-boost serial connection circuit 2a and the post-boost serial connection circuit 3a like a straight line, and it is further possible to dispose the second differential voltage amplifier circuit 3 between the pre-boost serial connection circuit 2a and the negative electrode side serial connection circuit 2b of the first differential voltage amplifier circuit 2.

(3) In the above embodiment, the pre-boost serial connection circuit 2a, the negative electrode side serial connection circuit 2b, the post-boost serial connection circuit 3a and the negative electrode side serial connection circuit 3b are curved like a U shape and disposed, however, the present invention is not limited thereto. The pre-boost serial connection circuit 2a, the negative electrode side serial connection circuit 2b, the post-boost serial connection circuit 3a and the negative electrode side serial connection circuit 3b can be curved like a U shape more than one time and disposed like a zigzag. In this case, it is possible to place even larger number of input resistor elements 2d1 and 3d1 in a predetermined area.

The invention claimed is:

1. An electric circuit device comprising:
a first high voltage serial connection circuit and a second high voltage serial connection circuit, those are provided on a board and connected to an end of high electric potential of a power source for automobile use; and
a first low voltage serial connection circuit and a second low voltage serial connection circuit, those are provided on the board and connected to an end of low electric potential of the power source for automobile use,
wherein the first high voltage serial connection circuit and the second high voltage serial connection circuit are respectively disposed on both surfaces of the board opposite to each other,
the first low voltage serial connection circuit and the second low voltage serial connection circuit are respectively disposed on the both surfaces of the board opposite to each other,
the first high voltage serial connection circuit is a pre-boost serial connection circuit connected to a positive electrode side of the power source for automobile, and
the second high voltage serial connection circuit is a post-boost serial connection circuit connected to a voltage boosting circuit.

2. The electric circuit device according to claim 1, wherein at least a portion of the second high voltage serial connection circuit is disposed, being displaced from the first high voltage serial connection circuit in a normal line direction of the surface of the board, and
wherein at least a portion of the second low voltage serial connection circuit is disposed, being displaced from the first low voltage serial connection circuit in the normal line direction of the surface of the board.

3. The electric circuit device according to claim 1, wherein at least either one of the first high voltage serial connection circuit, the second high voltage serial connection circuit, the first low voltage serial connection circuit and the second low voltage serial connection circuit is curved and disposed on the board.

4. The electric circuit device according to claim 1, wherein at least either one of the first high voltage serial connection circuit, the second high voltage serial connection circuit, the first low voltage serial connection circuit and the second low voltage serial connection circuit is curved like a U shape and disposed on the board.

5. The electric circuit device according to claim 1, wherein at least either one of the first high voltage serial connection circuit, the second high voltage serial connection circuit, the first low voltage serial connection circuit and the second low voltage serial connection circuit is disposed like a straight line on the board.

6. An electric circuit device comprising:
a first high voltage serial connection circuit and a second high voltage serial connection circuit, those are provided on a board and connected to an end of high electric potential of a power source for automobile use; and
a first low voltage serial connection circuit and a second low voltage serial connection circuit, those are provided on the board and connected to an end of low electric potential of the power source for automobile use,
wherein the first high voltage serial connection circuit and the second high voltage serial connection circuit are respectively disposed on both surfaces of the board opposite to each other,
the first low voltage serial connection circuit and the second low voltage serial connection circuit are respectively disposed on the both surfaces of the board opposite to each other,
wherein at least a portion of the second high voltage serial connection circuit is disposed, being displaced from the first high voltage serial connection circuit in a normal line direction of the surface of the board, and
wherein at least a portion of the second low voltage serial connection circuit is disposed, being displaced from the first low voltage serial connection circuit in the normal line direction of the surface of the board.

* * * * *